(12) United States Patent
Kawano (10) Patent No.: US 9,431,358 B2
(45) Date of Patent: Aug. 30, 2016

(54) AMPLIFIER

(71) Applicant: FUJITSU LIMITED, Kawasaki-shi, Kanagawa (JP)

(72) Inventor: Yoichi Kawano, Setagaya (JP)

(73) Assignee: FUJITSU LIMITED, Kawasaki (JP)

( * ) Notice: Subject to any disclaimer, the term of this patent is extended or adjusted under 35 U.S.C. 154(b) by 0 days.

(21) Appl. No.: 14/789,249

(22) Filed: Jul. 1, 2015

(65) Prior Publication Data

US 2016/0056768 A1 Feb. 25, 2016

(30) Foreign Application Priority Data

Aug. 19, 2014 (JP) .................. 2014-166717

(51) Int. Cl.
*H01L 23/66* (2006.01)
*H03F 1/34* (2006.01)
*H03F 3/195* (2006.01)
*H03F 3/60* (2006.01)

(52) U.S. Cl.
CPC .............. *H01L 23/66* (2013.01); *H03F 1/342* (2013.01); *H03F 3/195* (2013.01); *H03F 3/601* (2013.01); *H03F 3/607* (2013.01); *H03F 2200/153* (2013.01); *H03F 2200/72* (2013.01)

(58) Field of Classification Search
CPC ................................ H03F 3/2176; H03F 1/22
USPC .................................................. 330/310, 311
See application file for complete search history.

(56) References Cited

U.S. PATENT DOCUMENTS

| 5,821,813 A * | 10/1998 | Batchelor ................. H03F 3/62 330/277 |
| 6,177,837 B1 * | 1/2001 | Aoki .................. H03H 11/1213 330/303 |
| 2012/0229216 A1 * | 9/2012 | Benson ................... H03F 1/086 330/291 |

FOREIGN PATENT DOCUMENTS

| JP | 63-46007 | 2/1988 |
| JP | 2012-175438 | 9/2012 |

* cited by examiner

*Primary Examiner* — Henry Choe
(74) *Attorney, Agent, or Firm* — Fujitsu Patent Center (57) ABSTRACT

An amplifier includes: a first transistor that includes a first main electrode, a second main electrode, and a first control electrode, a first input signal being input to the first main electrode, a first output signal being output from the second main electrode; a reference potential line that is disposed on a signal line connected to the second main electrode with an insulator interposed therebetween; a first capacitor that is disposed between the first control electrode and the reference potential line; and a first phase shifter configured to shift a phase of a first return current such that the phase of the first return current which flows from the second main electrode to the first control electrode via the reference potential line and the first capacitor has a phase difference, which is greater than 90 degrees and less than 270 degrees, from the phase of the first input signal.

10 Claims, 9 Drawing Sheets

AMPLIFIER

CROSS-REFERENCE TO RELATED APPLICATION

This application is based upon and claims the benefit of priority of the prior Japanese Patent Application No. 2014-166717, filed on Aug. 19, 2014, the entire contents of which are incorporated herein by reference.

FIELD

Embodiments described herein generally relate to an amplifier.

BACKGROUND

A microwave multistage amplifier is known in which two or more amplifiers having the same characteristics are connected with a transmission line in a cascade manner and which includes a unit configured to adjust a line length of the transmission line (see Japanese Laid-open Patent Publication No. 63-46007).

A notch filter for forming an attenuation region between pass regions formed on a low frequency side and a high frequency side is known (see Japanese Laid-open Patent Publication No. 2012-175438). Plural phase-inversion inductors are connected in series as a series arm between an input port and an output port. First and second electrode portions are formed on one surface and the opposite surface of an insulating plate. A conduction path is formed in the insulating plate so as to connect the first electrode portion and the second electrode portion to each other. Plural element portions are parallel arms which cause series resonance at a frequency corresponding to the attenuation region, one end of which is connected between neighboring series arms and the other end of which is connected to the first electrode portion. A capacitance component is installed between the element portion and the second electrode portion and the capacitance value thereof is set so as to cause series resonance with an inductance component of the conduction path at a frequency corresponding to the attenuation region.

[Patent Document 1] Japanese Laid-open Patent Publication No. 63-46007
[Patent Document 2] Japanese Laid-open Patent Publication No. 2012-175438

A gate-grounded amplifier has a problem in that the gate-grounded amplifier oscillates at a predetermined frequency by positive feedback of a return current. A source-grounded amplifier has also the same problem. It is possible to prevent oscillation of an amplifier using a notch filter. However, since the notch filter attenuates a signal of a predetermined frequency band, there is a problem in that power loss is caused and a gain in the predetermined frequency band decreases.

SUMMARY

An amplifier includes: a first transistor that includes a first main electrode, a second main electrode, and a first control electrode, a first input signal being input to the first main electrode, a first output signal being output from the second main electrode; a reference potential line that is disposed on a signal line connected to the second main electrode of the first transistor with an insulator interposed therebetween; a first capacitor that is disposed between the first control electrode of the first transistor and the reference potential line; and a first phase shifter configured to shift a phase of a first return current such that the phase of the first return current which flows from the second main electrode of the first transistor to the first control electrode of the first transistor via the reference potential line and the first capacitor has a phase difference, which is greater than 90 degrees and less than 270 degrees, from the phase of the first input signal.

The object and advantages of the invention will be realized and attained by means of the elements and combinations particularly pointed out in the claims.

It is to be understood that both the foregoing general description and the following detailed description are exemplary and explanatory and are not restrictive of the invention.

DESCRIPTION OF EMBODIMENTS

First Embodiment

Figure 1A:
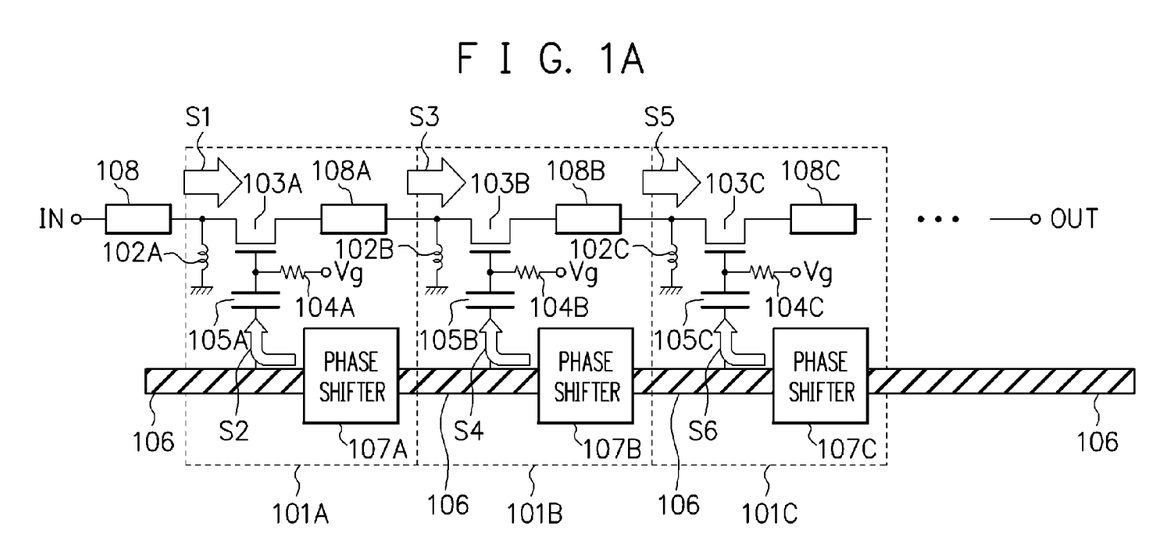
FIGS. 1A to 1C are diagrams illustrating an amplifier according to a first embodiment.

FIG. 1A is a diagram illustrating a configuration example of an amplifier according to a first embodiment. The amplifier includes an input terminal IN, an output terminal OUT, a reference potential line (ground potential line) 106, a first amplification unit 101A, a second amplification unit 101B, and a third amplification unit 101C. The first amplification unit 101A, the second amplification unit 101B, and the third amplification unit 101C are connected in series between the input terminal IN and the output terminal OUT.

The first amplification unit 101A includes a first inductor 102A, a first transistor 103A, a first resistor 104A, a first capacity 105A, a first phase shifter 107A, and a signal line 108A. The first transistor 103A is, for example, an n-channel field effect transistor and includes a source electrode (first main electrode), a drain electrode (second main electrode), and a gate electrode (first control electrode). The input terminal IN is connected to the source electrode of the first transistor 103A via a signal line 108. The signal line 108 includes a parasitic inductance component and serves as an input matching circuit of the first transistor 103A. An inductor may be used as the signal line 108.

The first inductor 102A is connected between the source electrode of the first transistor 103A and a ground potential node (first bias potential node). The source electrode of the first transistor 103A is supplied with a ground potential (first bias potential) from the ground potential node via the first inductor 102A.

The first resistor 104A is connected between the gate electrode of the first transistor 103A and a second bias potential node Vg. The gate electrode of the first transistor 103A is supplied with a second bias potential (positive potential) from the second bias potential node Vg via the first resistor 104A.

The first capacitor 105A is disposed between the gate electrode of the first transistor 103A and the reference potential line 106. The reference potential line 106 is, for example, a ground potential line. The drain electrode of the first transistor 103A is connected to the signal line 108A. The signal line 108A includes a parasitic inductance component and serves as an output matching circuit of the first transistor 103A. An inductor may be used as the signal line 108A.

The first transistor 103A receives a first input signal S1 from the input terminal IN via the source electrode thereof, amplifies the first input signal S1, and outputs a first output signal from the drain electrode thereof to the signal line 108A. The first input signal S1 is, for example, a high-frequency AC signal.

A case in which the first phase shifter 107A is not present will be first described. In this case, a second capacitor 105B is connected to the first capacitor 105A via the reference potential line 106. The signal line 108A is connected to the reference potential line 106 via an insulator. The first output signal of the signal line 108A is fed back as a first return current S2 to the gate electrode of the first transistor 103A via the insulator, the reference potential line 106, and the first capacitor 105A. In a predetermined frequency band around a frequency f1 illustrated in FIG. 7, the phase of the first return current S2 has a phase difference, the absolute value of which is less than 90 degrees, from the phase of the first input signal S1, the first return current S2 is positively fed back, and a gain in an oscillation state 701 is obtained. When the amplifier oscillates, the amplifier enters an unstable state.

Figure 1B:
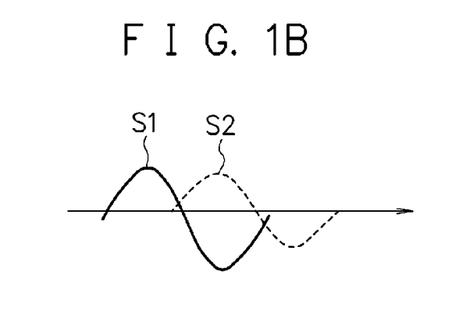
Figure 1C:
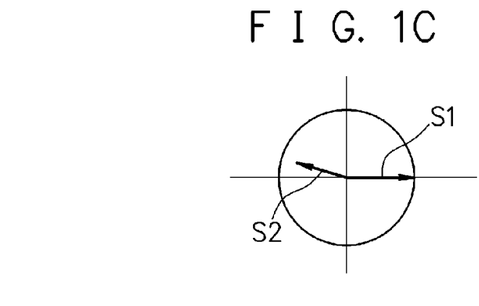
Figure 4:
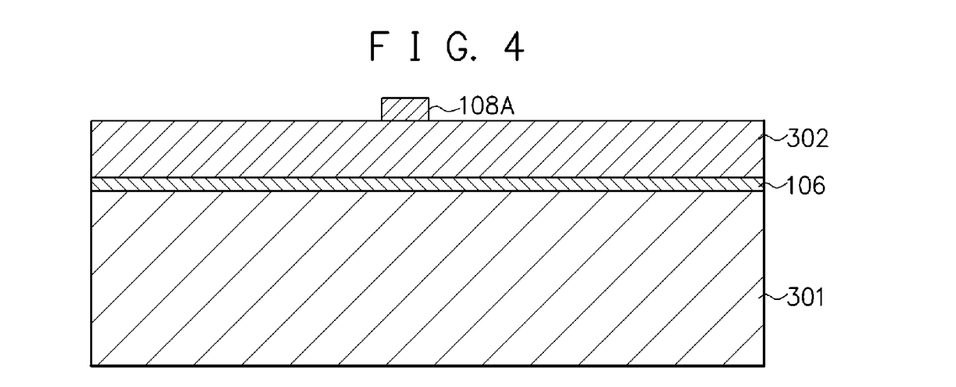
FIG. 4 is a cross-sectional view taken along line B-B of FIG. 2.

In this embodiment, in order to prevent oscillation of the amplifier, the first phase shifter 107A is provided. As illustrated in FIG. 4, the signal line 108A is connected to the reference potential line 106 connected to an input node of the first phase shifter 107A via an insulating film (insulator) 302. The first output signal of the signal line 108A is input to the input node of the first phase shifter 107A via the insulating film 302 and the reference potential line 106. As illustrated in FIGS. 1B and 1C, the first phase shifter 107A shifts the phase of the first return current S2 such that the phase of the first return current S2 which flows from the drain electrode of the first transistor 103A to the gate electrode of the first transistor 103A via the reference potential line 106 and the first capacitor 105A has a phase difference, which is greater than 90 degrees and less than 270 degrees, from the phase of the first input signal S1.

Figure 7:
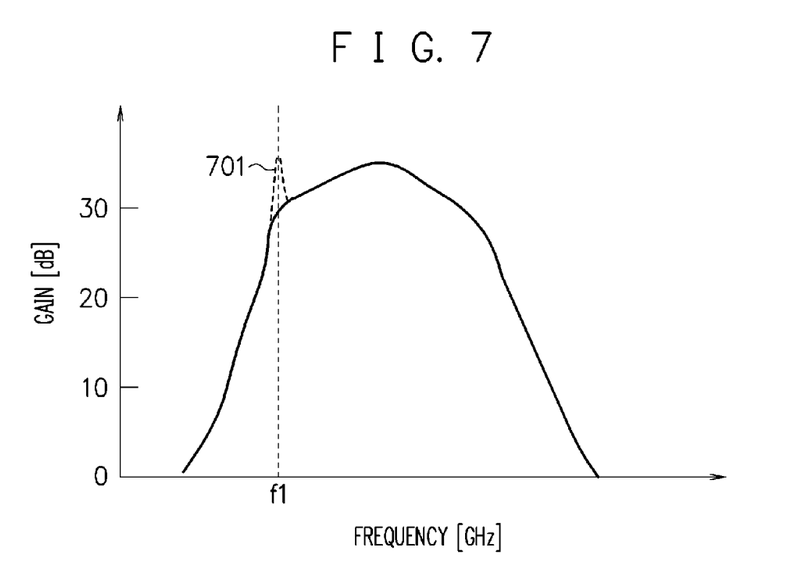
FIG. 7 is a diagram illustrating an example of a gain with respect to a frequency.

Since the phase of the first return current S2 has a phase difference, which is greater than 90 degrees and less than 270 degrees, from the phase of the first input signal S1, the first return current S2 is negatively fed back, the gain in an oscillation state 701 illustrated in FIG. 7 disappears to prevent the oscillation, and a stable gain indicated by a solid line in FIG. 7 is obtained. By disposing the first phase shifter 107A, the first return current S2 is negatively fed back, an unnecessary oscillation type is cancelled, and it is thus possible to prevent the oscillation of the amplifier and to cause the amplifier to stably operate.

As the phase difference between the phase of the first return current S2 and the phase of the first input signal S1 becomes closer to 180 degrees, the oscillation prevention effect becomes greater but the gain thereof becomes smaller. Therefore, it is preferable that the phase shift amount of the first phase shifter 107A be determined in consideration of the balance between the oscillation prevention effect and the gain.

In order to prevent the gain in an oscillation state 701 illustrated in FIG. 7, a method using a filter is considered. However, since a filter attenuates a signal in a predetermined frequency band, there is a problem in that power loss is caused and the gain in the predetermined frequency band decreases. In this embodiment, since the oscillation is prevented using the first phase shifter 107A instead of using a filter, it is possible to prevent a decrease in gain.

The second amplification unit 101B includes a second inductor 102B, a second transistor 103B, a second resistor 104B, a second capacity 105B, a second phase shifter 107B, and a signal line 108B. The second transistor 103B is, for example, an n-channel field effect transistor and includes a source electrode (third main electrode), a drain electrode (fourth main electrode), and a gate electrode (second control electrode). The source electrode of the second transistor 103B is connected to the drain electrode of the first transistor 103A via the signal line 108A. The signal line 108A includes a parasitic inductance component and serves as an input matching circuit of the second transistor 103B.

The second inductor 102B is connected between the source electrode of the second transistor 103B and the ground potential node. The source electrode of the second transistor 103B is supplied with the ground potential from the ground potential node via the second inductor 102B.

The second resistor 104B is connected between the gate electrode of the second transistor 103B and the second bias potential node Vg. The gate electrode of the second transistor 103B is supplied with the second bias potential (positive potential) from the second bias potential node Vg via the second resistor 104B.

The second capacitor 105B is disposed between the gate electrode of the second transistor 103B and the reference potential line 106. The drain electrode of the second transistor 103B is connected to the signal line 108B. The signal line 108B includes a parasitic inductance component and serves as an output matching circuit of the second transistor 103B. An inductor may be used as the signal line 108B.

The second transistor 103B receives a second input signal S3 from the drain electrode of the first transistor 103A via the source electrode thereof, amplifies the second input signal S3, and outputs a second output signal from the drain electrode thereof to the signal line 108B.

The signal line 108B is connected to the reference potential line 106 connected to an input node of the second phase shifter 107B via the insulating film (insulator) 302. The second output signal of the signal line 108B is input to the input node of the second phase shifter 107B via the insulating film 302 and the reference potential line 106. Similarly to the first phase shifter 107A, the second phase shifter 107B shifts the phase of a second return current S4 such that the phase of the second return current S4 which flows from the drain electrode of the second transistor 103B to the gate electrode of the second transistor 103B via the reference potential line 106 and the second capacitor 105B has a phase difference, which is greater than 90 degrees and less than 270 degrees, from the phase of the second input signal S3.

Since the phase of the second return current S4 has a phase difference, which is greater than 90 degrees and less than 270 degrees, from the phase of the second input signal S3, the second return current S4 is negatively fed back, the oscillation is prevented, and a stable gain is obtained. By disposing the second phase shifter 107B, it is possible to prevent the oscillation of the amplifier and to cause the amplifier to stably operate.

The third amplification unit 101C includes a third inductor 102C, a third transistor 103C, a third resistor 104C, a third capacity 105C, a third phase shifter 107C, and a signal line 108C. The third transistor 103C is, for example, an re-channel field effect transistor and includes a source electrode (fifth main electrode), a drain electrode (sixth main electrode), and a gate electrode (third control electrode). The source electrode of the third transistor 103C is connected to the drain electrode of the second transistor 103B via the signal line 108B. The signal line 108B includes a parasitic inductance component and serves as an input matching circuit of the third transistor 103C.

The third inductor 102C is connected between the source electrode of the third transistor 103C and the ground potential node. The source electrode of the third transistor 103C is supplied with the ground potential from the ground potential node via the third inductor 102C.

The third resistor 104C is connected between the gate electrode of the third transistor 103C and the second bias potential node Vg. The gate electrode of the third transistor 103C is supplied with the second bias potential (positive potential) from the second bias potential node Vg via the third resistor 104C.

The third capacitor 105C is disposed between the gate electrode of the third transistor 103C and the reference potential line 106. The drain electrode of the third transistor 103C is connected to the signal line 108C. The signal line 108C includes a parasitic inductance component and serves as an output matching circuit of the third transistor 103C. An inductor may be used as the signal line 108C.

The third transistor 103C receives a third input signal S5 from the drain electrode of the second transistor 103B via the source electrode thereof, amplifies the third input signal S5, and outputs a third output signal from the drain electrode thereof to the signal line 108C.

The signal line 108C is connected to the reference potential line 106 connected to an input node of the third phase shifter 107C via the insulating film (insulator) 302. The third output signal of the signal line 108C is input to the input node of the third phase shifter 107C via the insulating film 302 and the reference potential line 106. Similarly to the first phase shifter 107A, the third phase shifter 107C shifts the phase of a third return current S6 such that the phase of the third return current S6 which flows from the drain electrode of the third transistor 103C to the gate electrode of the third transistor 103C via the reference potential line 106 and the third capacitor 105C has a phase difference, which is greater than 90 degrees and less than 270 degrees, from the phase of the third input signal S5.

Since the phase of the third return current S6 has a phase difference, which is greater than 90 degrees and less than 270 degrees, from the phase of the third input signal S5, the third return current S6 is negatively fed back, the oscillation is prevented, and a stable gain is obtained. By disposing the third phase shifter 107C, it is possible to prevent the oscillation of the amplifier and to cause the amplifier to stably operate.

The first amplification unit 101A, the second amplification unit 101B, and the third amplification unit 101C are exemplified above, but four or more amplification units may be connected in series. The more the number of amplification units becomes, the greater the gain becomes but the more easily the gain in an oscillation state 701 illustrated in FIG. 7 occurs. In this case, by disposing the first phase shifter 107A, the second phase shifter 107B, and the third phase shifter 107C, it is possible to prevent the oscillation.

Recently, transmission speeds of wireless devices have increased more and more. One reason thereof is that a mainstream is changed from voice speech to data communication such as web browsing or music download in a terminal such as a smart phone. In the future, it is expected to realize an application for instantly downloading a large-capacity video such as movies. For this purpose, sub millimeter waves (300 GHz to 3 THz) can use much broader frequency bands in comparison with an existing low frequency band (10 GHz or less) and the transmission speed can be enhanced to such an extent. It is expected to realize a wireless communication device using sub millimeter wavelength band. In this case, there is demand for a high-gain amplifier for detecting an ultrahigh-frequency signal of 300 GHz. The amplifier illustrated in FIG. 1A can be used as such an amplifier.

Second Embodiment

Figure 2:
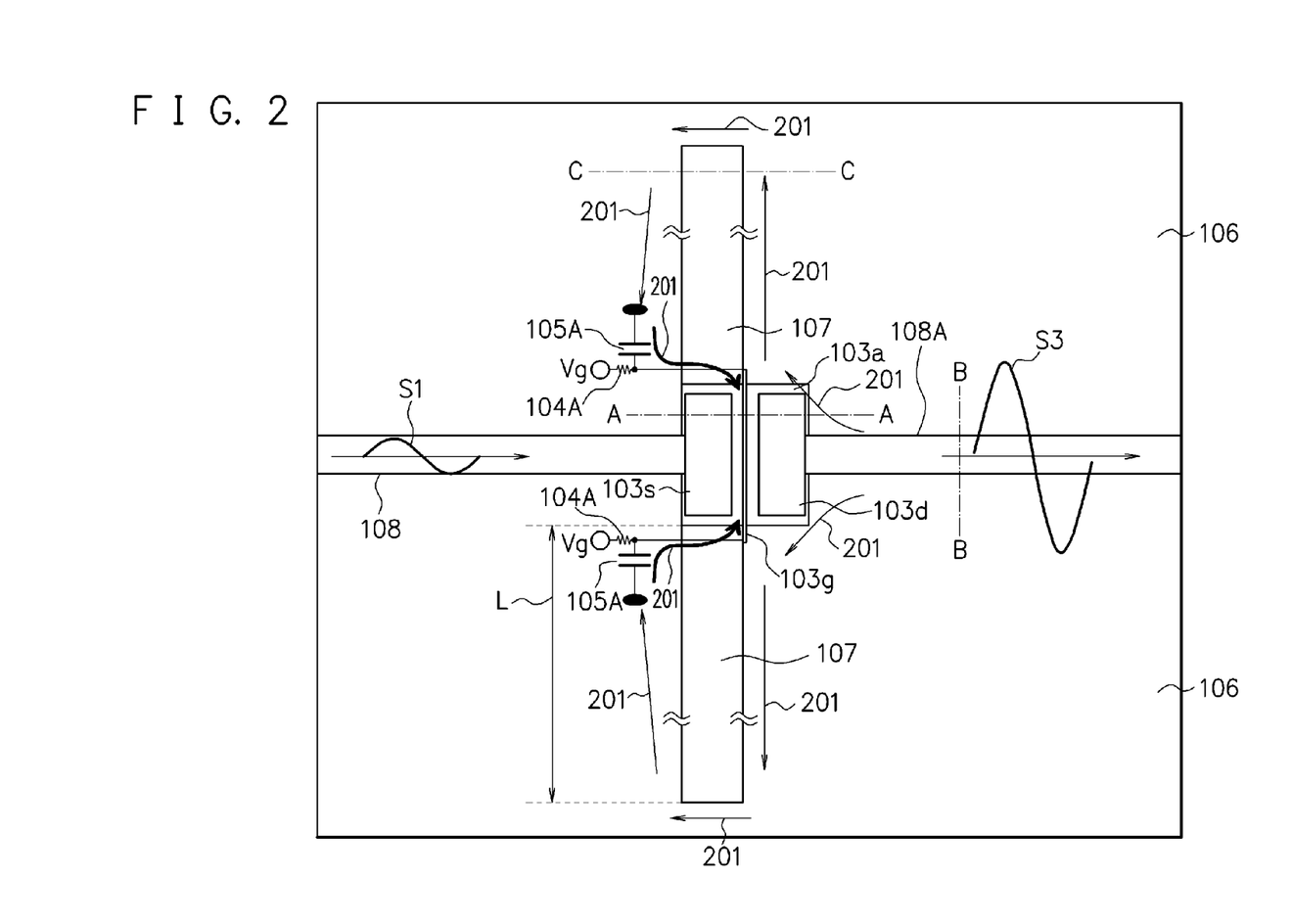
FIG. 2 is a diagram illustrating a configuration example of a first amplification unit according to a second embodiment.
Figure 3:
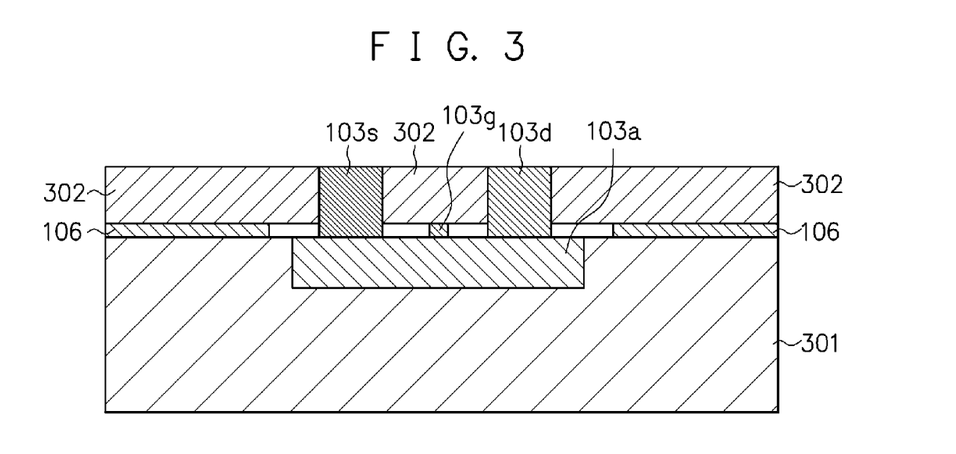
FIG. 3 is a cross-sectional view taken along line A-A of FIG. 2.
Figure 5:
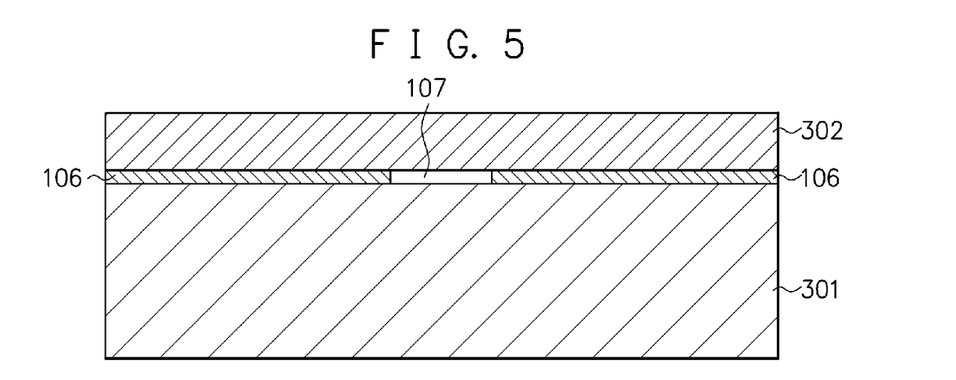
FIG. 5 is a cross-sectional view taken along line C-C of FIG. 2.

FIG. 2 is a diagram illustrating a configuration example of a first amplification unit 101A according to a second embodiment and illustrates a layout pattern of a semiconductor chip. FIG. 3 is a cross-sectional view taken along line A-A of FIG. 2, FIG. 4 is a cross-sectional view taken along line B-B of FIG. 2, and FIG. 5 is a cross-sectional view taken along line C-C of FIG. 2. The first amplification unit 101A will be described below for example, but the same is true of a second amplification unit 101B and a third amplification unit 101C.

A first wiring layer having a pattern of a reference potential line 106 including a slit 107 is formed on a semiconductor substrate 301. The reference potential line 106 is formed of a conductor and the conductor is removed from the slit 107. Accordingly, a return current can flow through the region of the reference potential line 106, but cannot flow through the region of the slit 107.

An insulating film 302 is formed on the first wiring layer having the reference potential line 106. A second wiring layer having signal lines 108, 108A, 108B, and 108C is formed on the insulating film 302. That is, a microstrip line is formed. The signal lines 108, 108A, 108B, and 108C and the reference potential line 106 are formed in different wiring layers.

As illustrated in FIG. 3, a first transistor 103A includes a source electrode 103s, a drain electrode 103d, a gate electrode 103g, and a transistor region 103a. The transistor region 103a is formed on the surface of the semiconductor substrate 301.

As illustrated in FIG. 2, two slits 107, two first capacitors 105A, and two first resistors 104A are formed to be symmetric with respect to the signal lines 108 and 108A.

The source electrode 103s is connected to the signal line 108. A first input signal S1 is input to the source electrode 103s via the signal line 108. The first transistor 103A amplifies the first input signal S1 and outputs the amplified signal as a first output signal from the drain electrode 103*d* thereof. The first output signal is divided into a second input signal S3 and a first return current S2. The second input signal S3 is input to the source electrode of a second transistor 103B via the signal line 108A.

The first return current S2 flows from the drain electrode 103*d* to the gate electrode 103*g* via a path 201. That is, the first return current S2 is a leak current which flows from the drain electrode 103*d* to the gate electrode 103*g* via the signal line 108A, the insulating film 302, the reference potential line 106, and the first capacitor 105A. Here, the first return current S2 does not flow through the region of the slit 107, but passes through a shortest path 201 in the region of the reference potential line 106 around the slit 107. The length of the path 201 corresponds to a delay time of the first return current S2. When the path 201 becomes longer, the delay time of the first return current S2 becomes longer. When the path 201 becomes shorter, the delay time of the first return current S2 becomes shorter. The length of the path 201 is about twice the length L of the slit 107.

An example in which oscillation at a frequency f1 illustrated in FIG. 7 is prevented will be described herein. A case in which the gain in an oscillation state 701 at the frequency f1 occurs when the slit 107 is not present will be described. The length L of the slit 107 is set to a length which is ¼ times the wavelength of the frequency f1 at which the amplifier oscillates when the slit 107 is not present. Accordingly, the length of the path 201 is set to a length which is half the wavelength of the frequency f1. In this case, the phase of the first return current S2 has a phase difference of 180 degrees from the phase of the first input signal S1. Since the first return current S2 is negatively fed back, a stable gain is obtained at the frequency f1 as indicated by a solid line in FIG. 7.

The first phase shifter 107A has the slit 107 formed in the pattern of the reference potential line 106 and can shift the phase of the first return current S2 depending on the length L of the slit 107.

The amplifier is a gate-grounded amplifier. The gate electrode 103*g* is connected to the reference potential line 106 via the first capacitor 105A and is AC-grounded. The slit 107 is opened in the pattern of the reference potential line 106 around the first transistor 103A. The first return current S2 bypasses the slit 107 and is returned to the gate electrode 103*g* via the path 201. At this time, when the length L of the slit 107 is set to a length which is ¼ times the wavelength of the frequency f1 at which oscillation may occurs, the phases of the first return current S2 and the first input signal S1 are reversed (have a ½ wavelength deviation) and the unnecessary wave cancelling effect can be achieved.

The slit 107 is preferably formed at the time of design of the amplifier in advance, but it may be difficult to expect the frequency at which the amplifier unnecessarily oscillates in the design step. In this case, when oscillation is observed in an amplifier test step, the slit 107 may be formed by trimming the pattern of the reference potential line 106 using an argon ion beam or the like. In this regard, it is preferable that the pattern of the reference potential line 106 be visible with eyes when the surface of the semiconductor chip is observed. As illustrated in FIG. 2, it is preferable that a circuit pattern interfering with the observation not be disposed in the region of the reference potential line 106 in which the slit 107 is formed.

Figure 6:
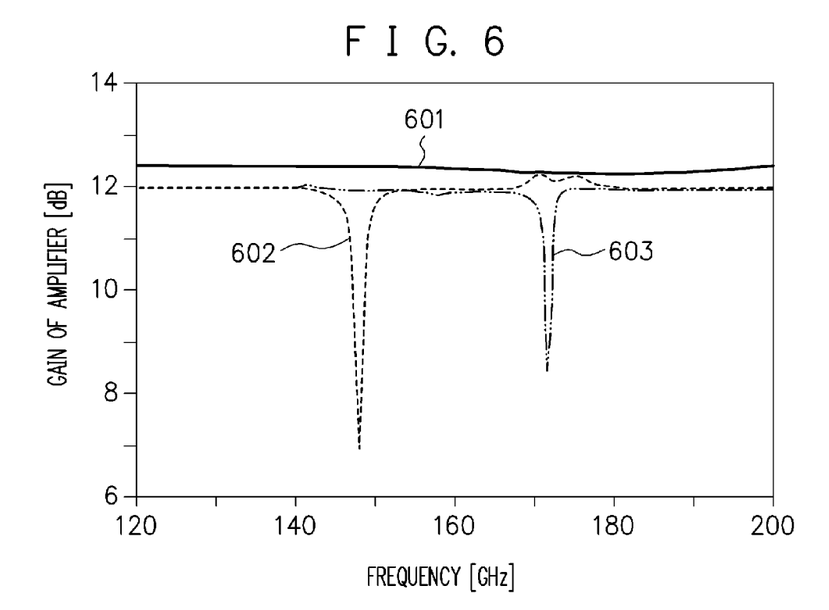
FIG. 6 is a diagram illustrating a simulation result of a gain of an amplifier with respect to a frequency.

FIG. 6 is a diagram illustrating a simulation result of a gain of the amplifier with respect to a frequency. In this example, the amplifier is a single-stage amplifier including only the first amplification unit 101A. Characteristic line 601 represents a characteristic when the slit 107 is not present. In this characteristic line, a decrease in gain at a specific frequency does not occur and, for example, the gain in an oscillation state 701 illustrated in FIG. 7 is achieved.

Characteristic line 602 represents a characteristic when the length L of the slit 107 is 240 μm. In this characteristic line, it is possible to decrease the gain at about 148 GHz. That is, oscillation at the frequency f1 around 148 GHz can be prevented.

Characteristic line 603 represents a characteristic when the length L of the slit 107 is 180 μm. In this characteristic line, it is possible to decrease the gain at about 172 GHz. That is, oscillation at the frequency f1 around 172 GHz can be prevented.

In this way, by forming the slit 107, it is possible to decrease the gain of the amplifier at a certain frequency and to prevent oscillation of the amplifier. By changing the length of the slit 107, it is possible to change the frequency at which the gain is decreased. That is, it is possible to control the frequency at which the prevention of oscillation is intended depending on the length L of the slit 107.

Third Embodiment

Figure 8:
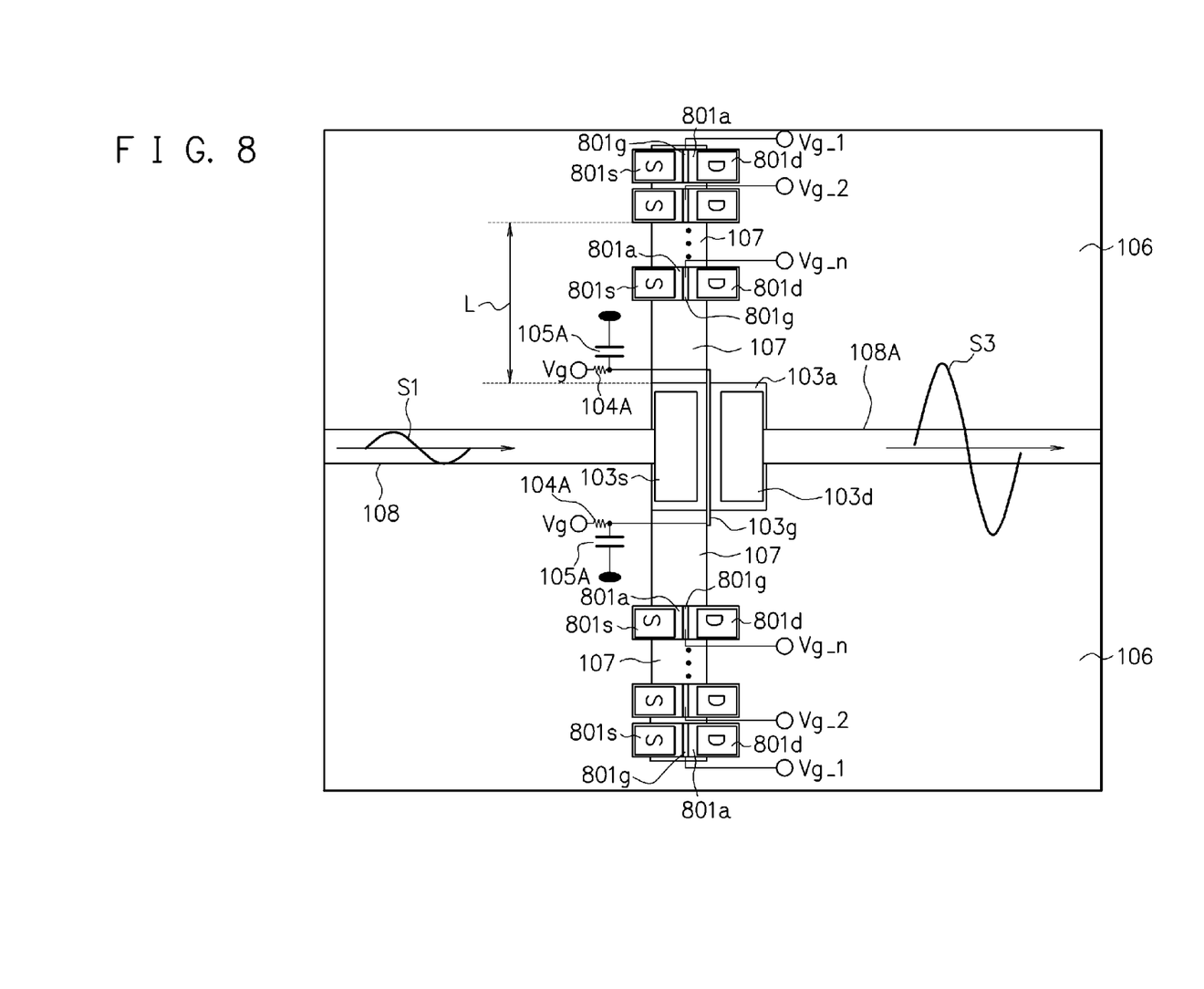
FIG. 8 is a diagram illustrating a configuration example of a first amplification unit according to a third embodiment.

FIG. 8 is a diagram illustrating a configuration example of a first amplification unit 101A according to a third embodiment and illustrates a layout pattern of a semiconductor chip. The first amplification unit 101A will be described for example, but the same is true of a second amplification unit 101B and a third amplification unit 101C.

In this embodiment (FIG. 8), plural transistors each including a source electrode 801*s*, a drain electrode 801*d*, a gate electrode 801*g*, and a transistor region 801*a* are added to the second embodiment (FIG. 2). Differences between this embodiment and the second embodiment will be described below.

Each slit 107 is provided with n transistors each including the source electrode 801*s*, the drain electrode 801*d*, the gate electrode 801*g*, and the transistor region 801*a*. The gate electrodes 801*g* of the n transistors are supplied with gate voltages $Vg\_1$ to $Vg\text{-}n$. The transistors of which the gate voltages $Vg\_1$ to $Vg\_n$ are switched to a high level are turned on to form a path connected to the reference potential line 106 over the slit 107. The transistors of which the gate voltages $Vg\_1$ to $Vg\_n$ are switched to a low level are turned off to cut off the connection to the reference potential line 106 over the slit 107. In order to control the length L of the slit 107, the transistors corresponding to the length L of the slit 107 are turned off and the transistors not corresponding to the length L of the slit 107 are turned on. For example, in FIG. 8, it is possible to set the length L of the slit 107 by turning on the transistors of the gate voltages $Vg\_1$ and $Vg\_2$ and turning off the transistors of the gate voltages $Vg\_3$ to $Vg\_n$. In this way, it is possible to change the length L of the slit 107 using the gate voltages $Vg\_1$ to $Vg\_n$. In this embodiment, the first phase shifter 107A includes the transistors for changing the length L of the slit 107.

In this embodiment, it is possible to adjust the length L of the slit 107 by controlling the gate voltages $Vg\_1$ to $Vg\_n$ instead of performing physical machining such as trimming after the amplifier oscillates. On the pattern of the reference potential line 106, plural transistors of the gate voltages $Vg\_1$ to $Vg\_n$ are disposed to bridge the slit 107. The transistors of the gate voltages $Vg\_1$ to $Vg\_n$ turn on and off the connections between the source electrodes 801*s* and the drain electrodes 801*d* depending on the gate voltages $Vg\_1$ to $Vg\_n$. When a transistor is turned on, the region of the slit 107 just below the transistor is short-circuited and the length L of the slit 107 is shortened. That is, it is possible to adjust the length L of the slit 107 by turning on and off the transistors. It is preferable that the transistors be controlled such that the lengths L of two slits 107 in upper and lower parts are equal to each other, but the transistors in a fourth embodiment to be described later can be controlled such that the lengths L of the two slits 107 in the upper and lower parts are different from each other.

Fourth Embodiment

Figure 9:
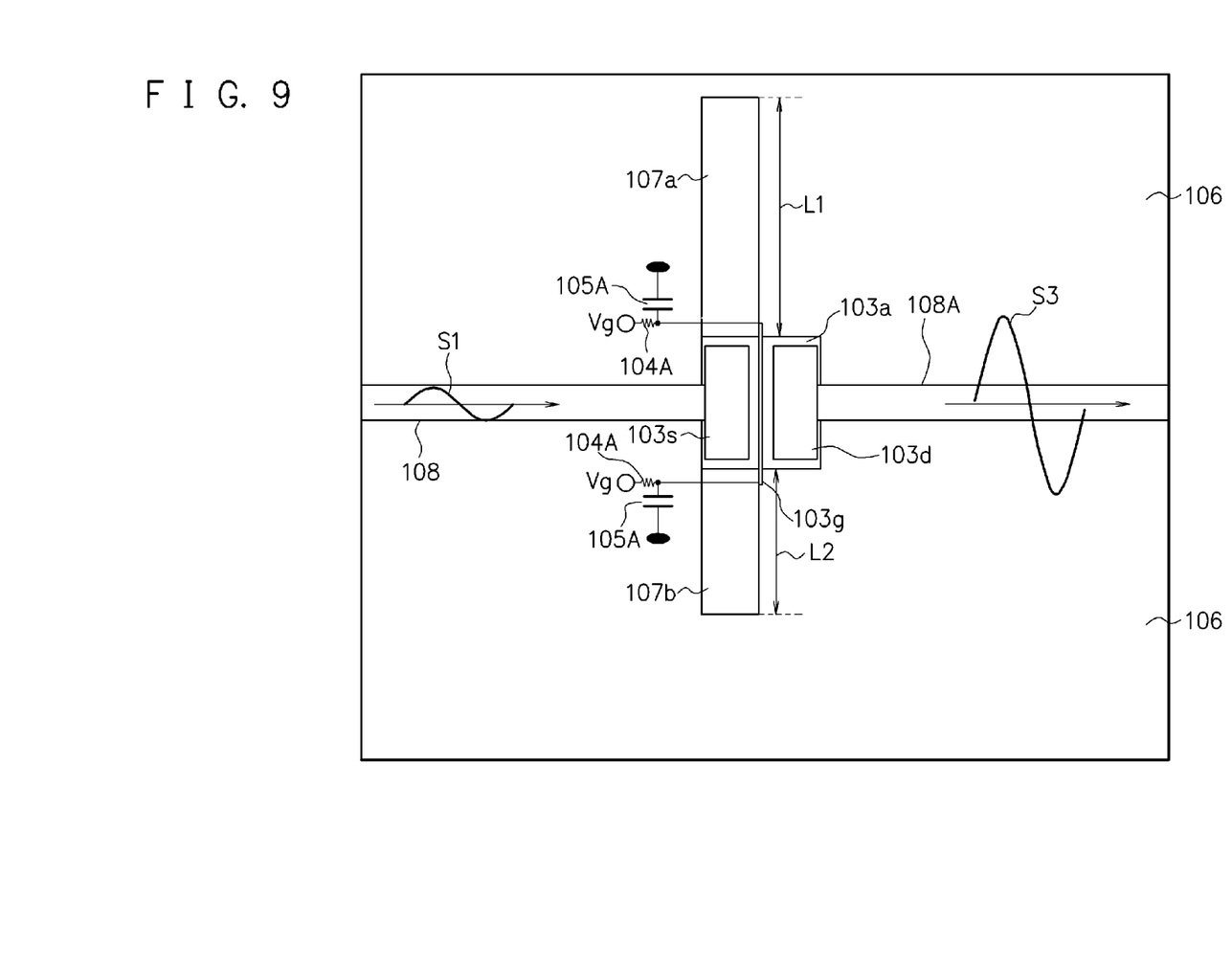
FIG. 9 is a diagram illustrating a configuration example of a first amplification unit according to a fourth embodiment.

FIG. 9 is a diagram illustrating a configuration example of a first amplification unit 101A according to a fourth embodiment and illustrates a layout pattern of a semiconductor chip. The first amplification unit 101A will be described for example, but the same is true of a second amplification unit 101B and a third amplification unit 101C.

In this embodiment (FIG. 9), the lengths of two slits 107a and 107b in the second embodiment (FIG. 2) are different from each other. Differences between this embodiment and the second embodiment will be described below. In FIG. 9, the slit 107a is a slit 107 disposed in the upper part of a transistor region 103a, and the slit 107b is a slit 107 disposed in the lower part of the transistor region 103a. The length L1 of the slit 107a is different from the length L2 of the slit 107b.

The first phase shifter 107A is disposed in the pattern of the reference potential line 106, includes the plural slits 107a and 107b having different lengths, and outputs plural first return currents S2 having different phases to the gate electrode 103g of the first transistor 103A by shifting the phase of the first return current S2 depending on the lengths L1 and L2 of the plural slits 107a and 107b.

For example, as illustrated in FIG. 6, the characteristic indicated by characteristic line 602 is achieved when the length L1 of the slit 107a is 240 µm, and the characteristic indicated by characteristic line 603 is achieved when the length L2 of the slit 107b is 180 µm. In this case, it is possible to prevent both oscillation around the frequency of 148 GHz and oscillation around the frequency of 172 GHz.

Figure 10:
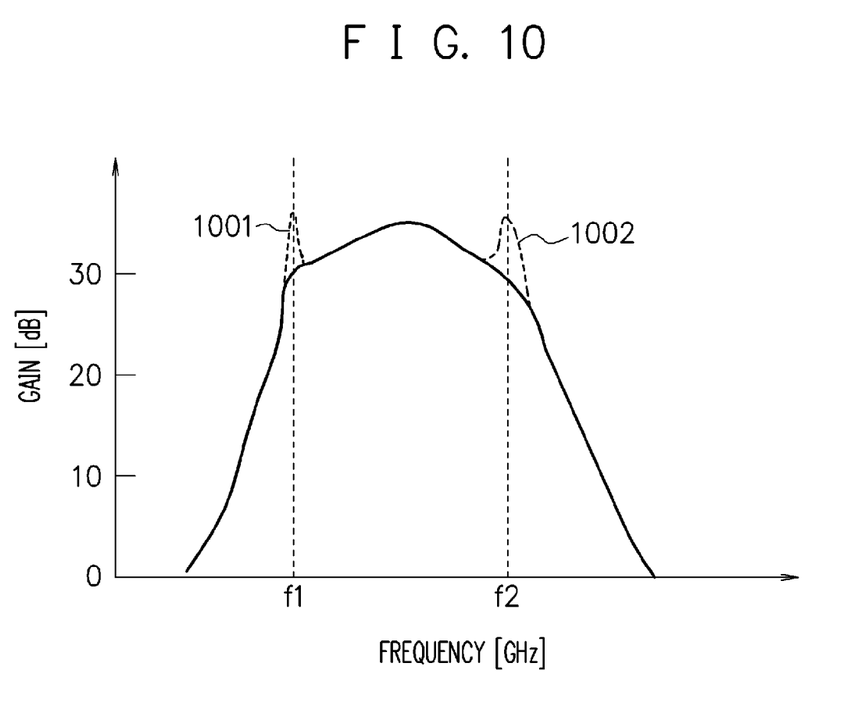
FIG. 10 is a diagram illustrating an example of a gain with respect to a frequency.

FIG. 10 is a diagram illustrating an example of the gain with respect to the frequency. When the slits 107a and 107b are not present, a gain in an oscillation state 1001 is achieved at the frequency f1, and a gain in an oscillation state 1002 is achieved at the frequency f2.

In this embodiment, the slits 107a and 107b are disposed, the length L1 of the slit 107a is set to a length for preventing the oscillation at the frequency f1, and the length L2 of the slit 107b is set to a length for preventing the oscillation at the frequency f2. Accordingly, as indicated by a solid line in FIG. 10, the gains in an oscillation state 1001 and 1002 disappear and it is thus possible to prevent the oscillation at the frequency f1 and the oscillation at the frequency f2.

As described above, by setting the length L1 of the slit 107a and the length L2 of the slit 107b to be different from each other, it is possible to prevent the oscillation at two different frequencies f1 and f2. In this case, the configuration of the slits 107a and 107b which are asymmetric in the vertical direction may be set in the design step, and the configuration may be realized by changing the number of transistors of the gate voltages Vg_1 to Vg_n which are turned on in two slits 107 in the upper and lower parts as illustrated in FIG. 8.

Fifth Embodiment

Figure 11:
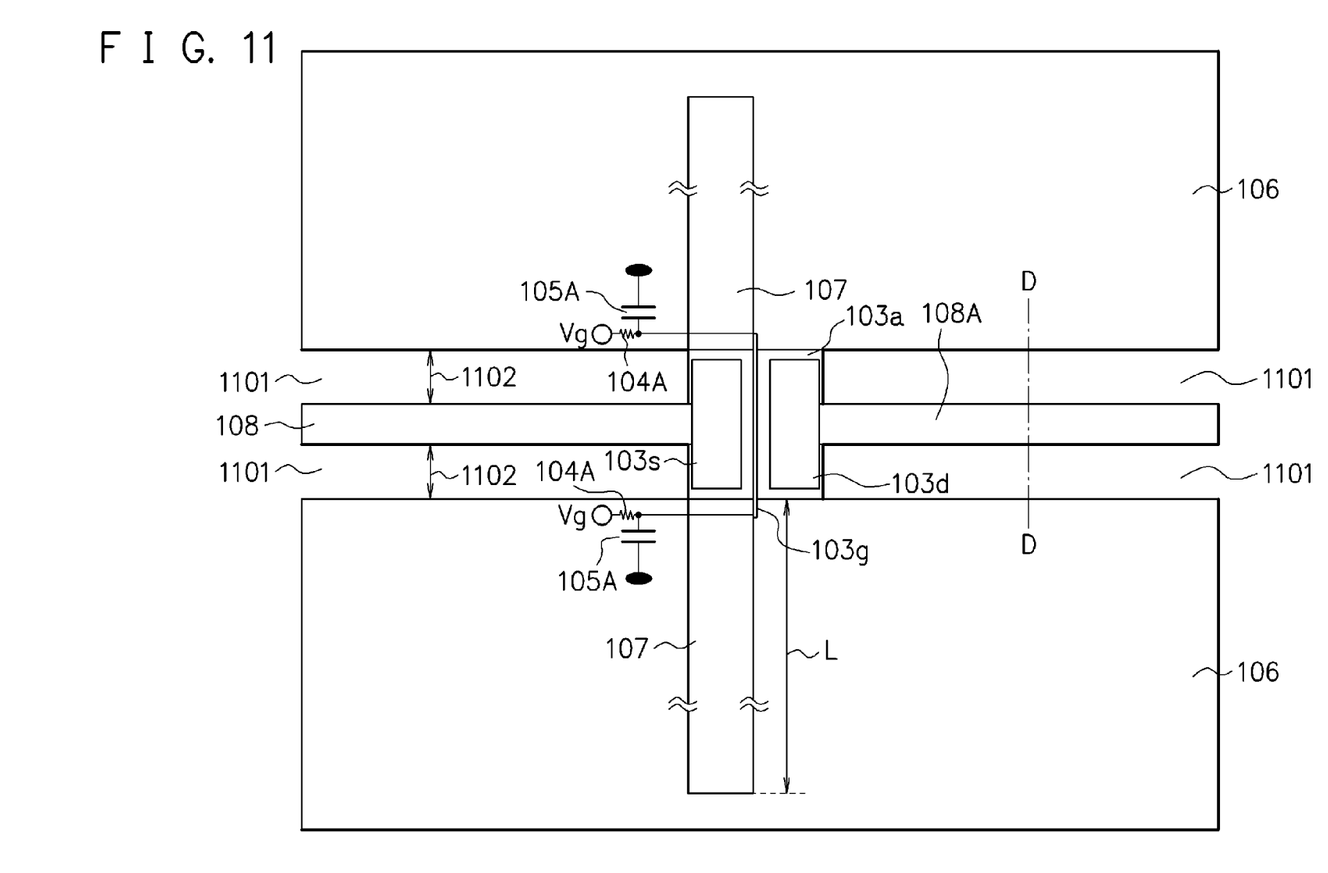
FIG. 11 is a diagram illustrating a configuration example of a first amplification unit according to a fifth embodiment.
Figure 12:
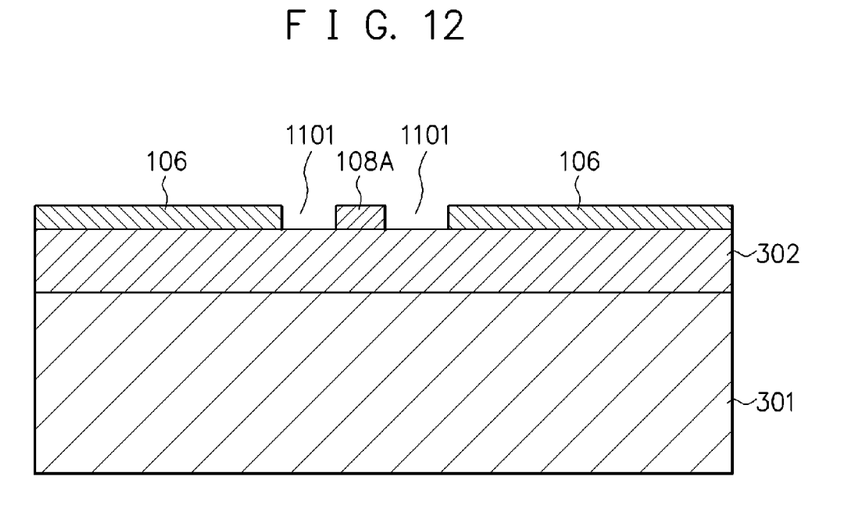
FIG. 12 is a cross-sectional view taken along line D-D of FIG. 11.

FIG. 11 is a diagram illustrating a configuration example of a first amplification unit 101A according to a fifth embodiment and illustrates a layout pattern of a semiconductor chip. FIG. 12 is a cross-sectional view taken along line D-D of FIG. 11. The first amplification unit 101A will be described for example, but the same is true of a second amplification unit 101B and a third amplification unit 101C.

In the second embodiment (FIGS. 2 and 4), the signal lines 108 and 108A are formed as a microstrip line. In this embodiment (FIGS. 11 and 12), the signal lines 108 and 108A are formed as a coplanar line. Differences between this embodiment and the second embodiment will be described below.

An insulating film 302 is formed on a semiconductor substrate 301. Patterns of the signal line 108A and the reference potential line 106 are formed on a wiring layer on the insulating film 302. The signal lines 108, 108B, and 108C are also formed similarly to the signal line 108A. The signal lines 108, 108A, 108B, and 108C and the reference potential line 106 are formed in the same wiring layer. The signal line 108A and the reference potential line 106 are electrically insulated from each other with a gap (insulator) 1101 interpose therebetween. Impedance of the signal lines 108 and 108A is determined depending on the length 1102 of the gap 1101. The first return current S2 flows from the drain electrode 103d to the gate electrode 103g via the signal line 108A, the gap 1101, the reference potential line 106, and the first capacitor 105A.

In the first to fifth embodiments, the first transistor 103A, the second transistor 103B, and the third transistor 103C are not limited to the n-channel field effect transistor, but may be p-channel field effect transistors or may be bipolar transistors.

When the first transistor 103A is a bipolar transistor, an emitter of the first transistor 103A is the first main electrode, a collector thereof is the second main electrode, and a base thereof is the first control electrode. Similarly, when the second transistor 103B is a bipolar transistor, an emitter of the second transistor 103B is the third main electrode, a collector thereof is the fourth main electrode, and a base thereof is the second control electrode. Similarly, when the third transistor 103C is a bipolar transistor, an emitter of the third transistor 103C is the fifth main electrode, a collector thereof is the sixth main electrode, and a base thereof is the third control electrode.

According to the first to fifth embodiments, it is possible to realize negative feedback of the first return current S2, the second return current S4, and the third return current S6 by disposing the first phase shifter 107A, the second phase shifter 107B, and the third phase shifter 107C. It is possible to prevent oscillation by the negative feedback of the first return current S2, the second return current S4, and the third return current S6. Since a filter is not used, it is possible to prevent a decrease in gain.

The above-mentioned embodiments merely describe examples for carrying out the invention, and the technical scope of the invention will not be definitely analyzed by the embodiments. That is, the invention can be modified in various forms without departing from the technical idea and the principal features thereof.

It is possible to prevent oscillation by negative feedback of a first return current. Since no filter is used, it is possible to prevent a decrease in gain.

All examples and conditional language provided herein are intended for the pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority and inferiority of the invention. Although one or more embodiments of the present invention have been described in detail, it should be understood that the various changes, substitutions, and alterations could be made hereto without departing from the spirit and scope of the invention.

What is claimed is:

1. An amplifier comprising:
   a first transistor that includes a first main electrode, a second main electrode, and a first control electrode, a first input signal being input to the first main electrode, a first output signal being output from the second main electrode;
   a reference potential line that is disposed on a signal line connected to the second main electrode of the first transistor with an insulator interposed therebetween;
   a first capacitor that is disposed between the first control electrode of the first transistor and the reference potential line; and
   a first phase shifter configured to shift a phase of a first return current such that the phase of the first return current which flows from the second main electrode of the first transistor to the first control electrode of the first transistor via the reference potential line and the first capacitor has a phase difference, which is greater than 90 degrees and less than 270 degrees, from the phase of the first input signal.

2. The amplifier according to claim 1, wherein the first phase shifter includes a slit which is formed in a pattern of the reference potential line and shifts the phase of the first return current depending on the length of the slit.

3. The amplifier according to claim 2, wherein the length of the slit is ¼ times a wavelength of a frequency at which the amplifier oscillates when there is no slit.

4. The amplifier according to claim 2, wherein the first phase shifter includes a transistor that changes the length of the slit.

5. The amplifier according to claim 1, wherein the first phase shifter includes a plurality of slits which are disposed in a pattern of the reference potential line and which have different lengths, and outputs a plurality of first return currents having different phases to the first control electrode of the first transistor by shifting the phase of the first return current depending on the lengths of the plurality of slits.

6. The amplifier according to claim 1, wherein the signal line and the reference potential line are respectively disposed in different wiring layers.

7. The amplifier according to claim 1, wherein the signal line and the reference potential line are disposed in the same wiring layer.

8. The amplifier according to claim 1, wherein a signal line connected to the first main electrode of the first transistor and the signal line connected to the second main electrode of the first transistor have an inductance component.

9. The amplifier according to claim 1, further comprising:
   a first inductor that is disposed between the first main electrode of the first transistor and a first bias potential node; and
   a first resistor that is disposed between the first control electrode of the first transistor and a second bias node.

10. The amplifier according to claim 1, further comprising:
    a second transistor that includes a third main electrode, a fourth main electrode, and a second control electrode, a second input signal being input from the second main electrode of the first transistor to the third main electrode, a second output signal being output from the fourth main electrode;
    a second capacitor that is disposed between the second control electrode of the second transistor and the reference potential line; and
    a second phase shifter configured to shift a phase of a second return current such that the phase of the second return current which flows from the fourth main electrode of the second transistor to the second control electrode of the second transistor via the reference potential line and the second capacitor has a phase difference, which is greater than 90 degrees and less than 270 degrees, from the phase of the second input signal.

* * * * *